United States Patent
Andreev et al.

(10) Patent No.: US 7,512,918 B2
(45) Date of Patent: Mar. 31, 2009

(54) MULTIMODE DELAY ANALYSIS FOR SIMPLIFYING INTEGRATED CIRCUIT DESIGN TIMING MODELS

(75) Inventors: Alexander Andreev, San Jose, CA (US);
Andrey Nikitin, Moscow (RU); Ranko Scepanovic, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 490 days.

(21) Appl. No.: 11/205,365

(22) Filed: Aug. 17, 2005

(65) Prior Publication Data

US 2007/0044053 A1     Feb. 22, 2007

(51) Int. Cl.
*G06F 17/50*     (2006.01)

(52) U.S. Cl. .................. 716/6; 716/2; 716/4; 716/5; 716/10; 703/15; 703/19

(58) Field of Classification Search .......... 716/1, 716/2, 5–7, 9, 11, 13, 18, 19; 703/15, 19; 365/49; 324/537
See application file for complete search history.

(56) References Cited

U.S. PATENT DOCUMENTS

| | | | | |
|---|---|---|---|---|
| 5,452,239 | A * | 9/1995 | Dai et al. | 703/19 |
| 5,801,958 | A * | 9/1998 | Dangelo et al. | 716/18 |
| 5,910,897 | A * | 6/1999 | Dangelo et al. | 716/19 |
| 5,933,356 | A * | 8/1999 | Rostoker et al. | 703/15 |
| 5,943,252 | A * | 8/1999 | Schultz et al. | 365/49 |
| 6,002,861 | A * | 12/1999 | Butts et al. | 703/16 |
| 6,023,568 | A * | 2/2000 | Segal | 716/6 |
| 6,334,205 | B1 * | 12/2001 | Iyer et al. | 716/7 |
| 6,467,067 | B1 * | 10/2002 | Andreev et al. | 716/4 |
| 6,532,582 | B1 * | 3/2003 | Zolotykh et al. | 716/11 |
| 6,587,990 | B1 * | 7/2003 | Andreev et al. | 716/2 |
| 6,615,392 | B1 * | 9/2003 | Nadeau-Dostie et al. | 716/5 |
| 6,622,291 | B1 * | 9/2003 | Ginetti | 716/9 |
| 6,658,628 | B1 * | 12/2003 | Landy et al. | 716/1 |
| 6,760,894 | B1 * | 7/2004 | Yalcin et al. | 716/6 |
| 6,845,494 | B2 * | 1/2005 | Burks et al. | 716/6 |
| 6,983,432 | B2 * | 1/2006 | Hayes | 716/4 |
| 6,996,515 | B1 * | 2/2006 | Foltin et al. | 703/19 |
| 7,103,863 | B2 * | 9/2006 | Riepe et al. | 716/7 |

(Continued)

OTHER PUBLICATIONS

Chiu et al.; "Primitive interval labelled net model and timing modelling of logic circuits"; Jun. 11-14, 1991 ; Circuits and Systems, 1991., IEEE International Sympoisum on; pp. 934-937 vol. 2.*

(Continued)

*Primary Examiner*—Helen Rossoshek
(74) *Attorney, Agent, or Firm*—Luedeka Neely & Graham, P.C.

(57) ABSTRACT

A method of analyzing multimode delay in an integrated circuit design to produce a timing model for the integrated circuit design, by inputting a net list, IO arc delays, interconnection arc delays, and constant nets with assigned Boolean functions for the integrated circuit design, propagating the constant nets and assigning Boolean conditions to the IO arc delays and the interconnection arc delays, evaluating timing path delays and conditions for the integrated circuit design, creating the integrated circuit design timing model parameters, and outputting the integrated circuit design timing model. The method is especially desirable for netlists with very complicated mixing logics that include muxing of clocks. In particular, RRAMs are such netlists.

3 Claims, 4 Drawing Sheets

U.S. PATENT DOCUMENTS

| | | | | |
|---|---|---|---|---|
| 7,155,691 B2* | 12/2006 | Ratzlaff | | 716/6 |
| 7,171,633 B1* | 1/2007 | Hwang et al. | | 716/2 |
| 7,188,327 B2* | 3/2007 | Hahn | | 716/6 |
| 7,200,826 B2* | 4/2007 | Andreev et al. | | 716/6 |
| 7,213,221 B1* | 5/2007 | Celik et al. | | 716/6 |
| 7,219,048 B1* | 5/2007 | Xu | | 703/19 |
| 7,239,996 B2* | 7/2007 | Boland et al. | | 703/19 |
| 7,243,323 B2* | 7/2007 | Williams et al. | | 716/6 |
| 7,315,993 B2* | 1/2008 | Nikitin et al. | | 716/5 |
| 7,380,223 B2* | 5/2008 | Panteleev et al. | | 716/3 |
| 2003/0187815 A1* | 10/2003 | Andreev et al. | | 707/1 |
| 2005/0046426 A1* | 3/2005 | Buheis et al. | | 324/537 |
| 2006/0117281 A1* | 6/2006 | Nikitin et al. | | 716/5 |
| 2006/0230373 A1* | 10/2006 | Dirks et al. | | 716/6 |
| 2007/0234253 A1* | 10/2007 | Soreff et al. | | 716/6 |
| 2007/0234266 A1* | 10/2007 | Chen et al. | | 716/13 |

OTHER PUBLICATIONS

Lee et al.; "On the signal bounding problem in timing analysis"; Nov. 4-8, 2001; Computer Aided Design, 2001. ICCAD 2001. IEEE/ACM International Conference on; pp. 507-514.*

* cited by examiner

MULTIMODE DELAY ANALYSIS FOR SIMPLIFYING INTEGRATED CIRCUIT DESIGN TIMING MODELS

FIELD

This invention relates to the field of integrated circuit fabrication. More particularly, this invention relates to mathematical modeling of integrated circuits during the design process.

BACKGROUND

Integrated circuits are often formed using an application specific integrated circuit architecture, which tends to reduce the design costs of the integrated circuit by mixing and matching pre-designed functional blocks in a somewhat customized arrangement to produce an integrated circuit according to a customer's specifications. One functional block of such a customizable integrated circuit design is referred to as Reconfigurable RAM, or RRAM for short.

RRAM contains sets of memories of the same type that are placed compactly within a memory matrix. An RRAM, as the term is used herein, is a mega cell that can be considered as a set of memories with built-in self testing and built-in self correction.

During the design phase of integrated circuits, a delay analysis is typically performed, where the delays of the nets within the integrated circuit are characterized. For some integrated circuit designs this is not such a difficult problem. However, for very complex circuits, such as RRAMs, there may be on the order of about twenty thousand different nets to investigate. The repeated and separate consideration of each one of these nets for each change that is made to the design can place a serious burden on the delay analysis tool.

What is needed, therefore, is a system that enables more accurate and timely mathematical modeling for the design of RRAM.

SUMMARY

The above and other needs are met by a method of analyzing multimode delay in an integrated circuit design to produce a timing model for the integrated circuit design, by inputting a net list, IO arc delays, interconnection arc delays, and constant nets with assigned Boolean functions for the integrated circuit design, propagating the constant nets and assigning Boolean conditions to the IO arc delays and the interconnection arc delays, evaluating timing path delays and conditions for the integrated circuit design, creating the integrated circuit design timing model parameters, and outputting the integrated circuit design timing model.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
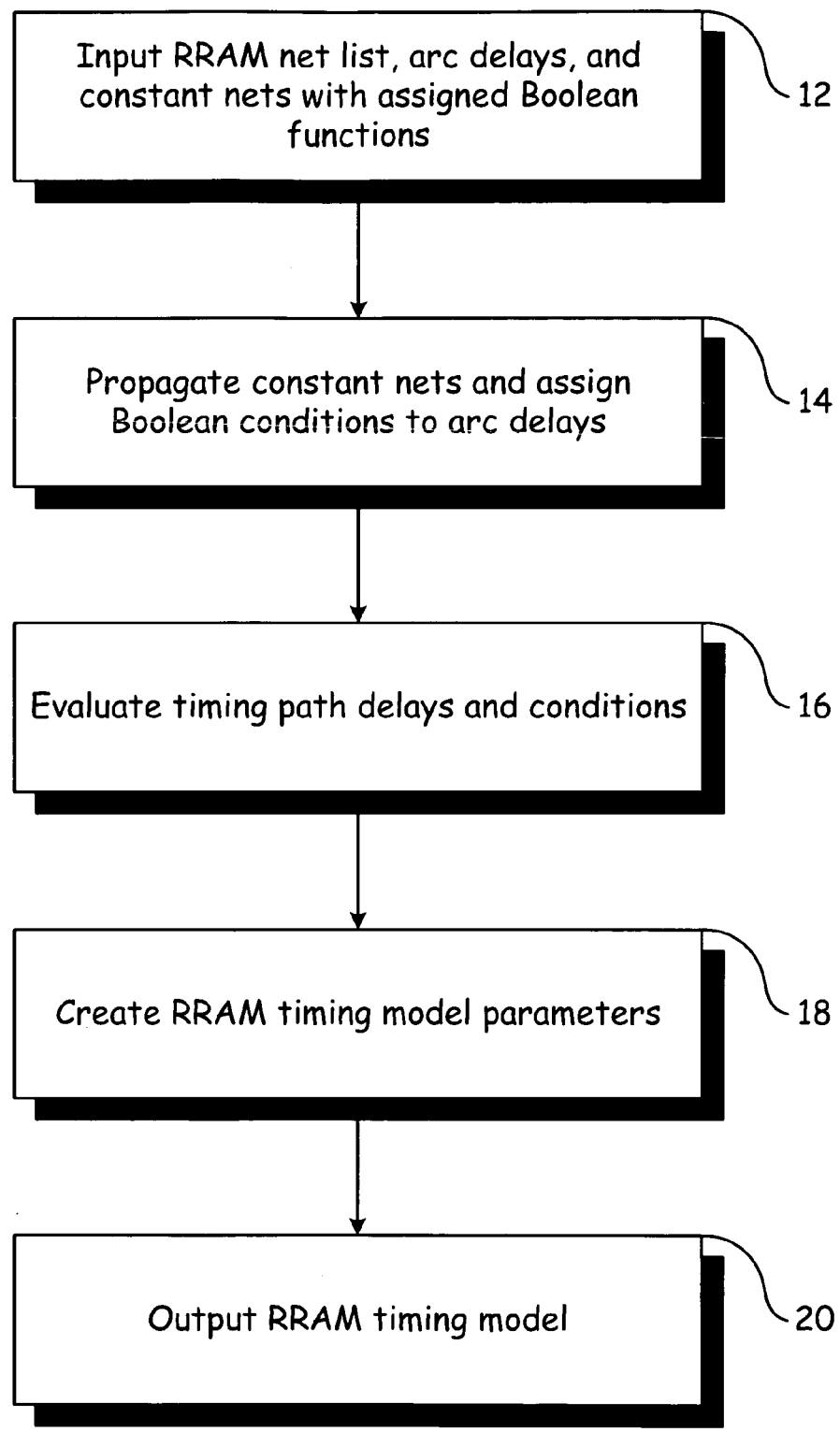
FIG. 1 is a flow chart of a method of creating a timing model according to a preferred embodiment of the present invention.

The multimode delay analyzer according to a preferred embodiment of the present invention analyzes RRAMs and builds timing models for these mega cells. Although this tool is suited for usage in the design of an RRAM, it also can be used for timing analysis of any other mega cell.

RRAMs are defined by net lists with prepared placement and routing. The net list typically contains cells of the following types: memories, flip flops, latches, and logical cells. The delays of the IO timing arcs of the RRAM cells (called IO arcs) and the delays of the interconnections of the RRAM cells (called interconnection arcs) are preferably evaluated by some other tool and defined as the input of the delay analyzer. The delay analyzer considers the IO arcs and the interconnection arcs and generates the timing model for the RRAM mega cell as a library cell. This timing model includes IO arcs that connect inputs and outputs of the RRAM mega cell and timing restrictions (setup and hold times, recoveries and skews, clock minimal widths and periods).

The problem solved by a delay analyzer according to a preferred embodiment of the present invention is a well-know problem that is solved in many other tools, but these tools do not take into account some special features that are particular for the RRAM net lists. The RRAM net lists contain a lot of muxing logics. At least some of the muxing logics work "constantly," meaning that the control signals of the muxing logics do not change their values during operation of the RRAM. This fact makes it possible to not completely recompute many of the IO arcs and interconnection arcs of the muxing logics during iterations of the delay analysis. This is a basic principle of the multimode delay analyzer described herein. An example that validates this base principle is given below.

Proof of Concept

Let us consider the following net list:
module TEST (SD, SCP, D1, D2, CP1, CP2, Q)
   input SD, SCP, D1, D2, CP1, CP2;
   output Q;
   wire D, CP;
   MUX21 ins1 (.A(D1),.B(D2),.S(SD),.Z(D));
   MUX21 ins2 (.A(CP1),.B(CP2),.S(SCP),.Z(CP));
   FLIPFLOP ins3 (.D(D),.CP(CP),.Q(Q));
endmodule The net list TEST contains mux ins1 for muxing data D1 and D2, mux ins2 for muxing clocks CP1 and CP2 and flip flop ins3. Let all interconnection arcs delays be zeroes (ins1.Z->ins3.D, ins2.Z->ins3.CP). Assume the delays of IO arcs as given below:
   ins1.A->ins1.Z–0.05
   ins1.B->ins1.Z–0.1
   ins1.S->ins1.Z–0.1
   ins2.A->ins2.Z–0.05
   ins2.B->ins2.Z–0.1
   ins2.S->ins2.Z–0.1
   ins3.CP->ins3.Q–0.15.

Let the flip flop ins3 have the timing restriction: SETUP D CP 0.07.

If we know nothing about the values of the inputs SD and SCP (which are the values of the control inputs of muxes), then we obtain the following timing for the mega cell TEST:

IO path CP1->Q=0.05+0.15=0.2
IO path CP2->Q=0.1+0.15=0.25
SETUP D1 CP1=0.07+0.05−0.05=0.07
SETUP D1 CP2=0.07+0.05−1.0=0.02
SETUP D2 CP1=0.07+0.1−0.05=0.12
SETUP D2 CP2=0.07+0.1−0.1=0.07.

If we know that the input SD has the constant value 0, and the input SCP has the constant value 1, then the IO path CP1 approaches Q and the SETUPs (D1, CP1), (D2, CP1), (D2, CP2) are disabled. If we know that the inputs SD and SCP are constant and have equal values (even if we don't know whether the value is zero or one) than the SETUPs (D1, CP2) and (D2, CP1) are disabled.

Construction of Delay Analyzer

The example above shows that the analysis of the constant nets of the net list (especially if these nets are connected to muxes) may sufficiently change the timing model of the mega cell. It allows us to reduce the number of timing IO arcs and timing restrictions, and decrease the values of arc delays. According to the present invention, we describe herein a multimode delay analyzer that considers the constant nets. The proposed delay analyzer deals not only with constant nets with known values (power 1 or ground 0), but also with constant nets with unknown values (we know that the net does not change its value, but we don't know exactly if it is a power net or ground net).

Let X be a set of Boolean variables X={x1, x2, ... }. To each constant net of the net list we assign some Boolean function that depends on the Boolean variables X. The meaning of this Boolean function is the value of this constant net. This function may be constant 0 or 1. In this case the corresponding constant net is a net with known value. Otherwise the constant net is a net with unknown value defined by the Boolean function. In our example TEST as given above, if we want to set the inputs SD and SCP to have equal, unknown values, then we should assign the same Boolean function F=x1 to each of the nets SD and SCP.

By varying the values (0 or 1) of the Boolean variables X, we can obtain the different values of the constant nets as far as these values are Boolean functions of variables X. Each set of constant net values defines some mode of net list work. That is why the delay analyzer according to a preferred embodiment of the present invention is called a multimode delay analyzer.

RRAM mega cells with memory built in self repair support have a large number of different sets of constant net values. For example, if a given RRAM contains fifty memories, and the RRAM can repair three memories, than the number of the different repairing modes of the RRAM is (48*49*50)/(2*3) =19,600, which is the number of triples of faulted memories. The consideration of all these modes separately becomes too expensive, because consideration of each mode requires a mathematical routine to work on the description of the false paths that appear in that mode. The delay analyzer according to the present invention is capable of analyzing all possible built in self repair modes in parallel, as described below.

Let Y be a set of some auxiliary Boolean variables Y={y1, y2, ... }. We will use these variables in the embodiment of the invention described herein. The multimode delay analyzer procedure 10 according to the preferred embodiment is given below and generally depicted in FIG. 1:

1. Input the RRAM net list, IO arc delays, interconnection arc delays, and the constant nets with assigned Boolean functions, as given in block 12.
2. Make the constant net propagations and assign Boolean conditions to IO arc delays and interconnection arc delays, as given in block 14.
3. Evaluate timing path delays and conditions, as given in block 16.
4. Create RRAM timing model parameters, as given in block 18.
5. Output RRAM timing model, as given in block 20.

Steps 2, 3, and 4 of the multimode delay analyzer as given above are now explained in greater detail.

2. Constant Net Propagation and Boolean Assignment

Figure 2:
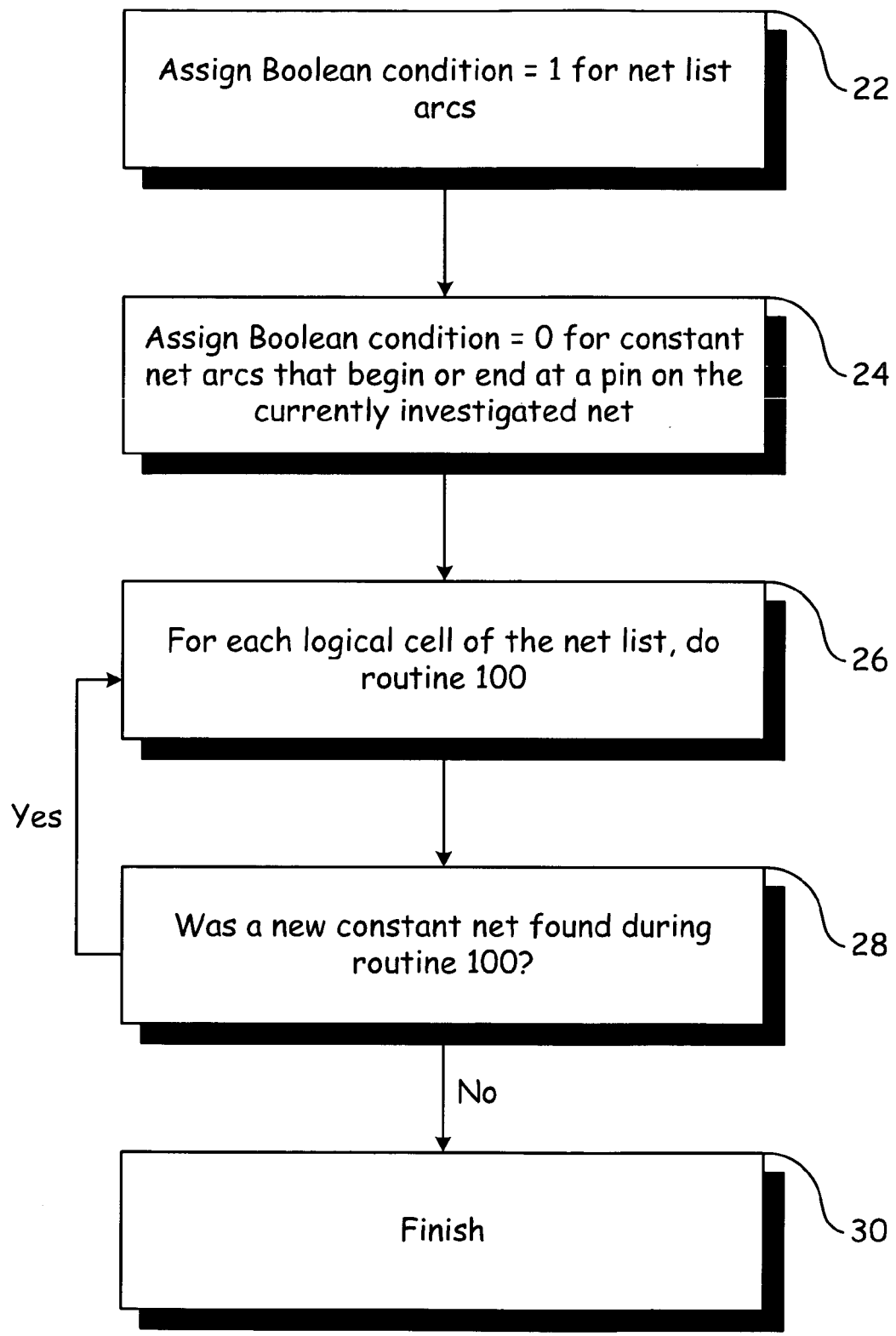
FIG. 2 is a flow chart of a method of propagating constant nets and assigning Boolean conditions to arc delays according to a preferred embodiment of the present invention.

Step 2 as given above and as depicted in FIG. 1 as block 14 is described in more detail in regard to routine 14 depicted in FIG. 2.

2.1. Initially, we assign the Boolean condition (Boolean condition is some Boolean function that depends on Boolean variables X) to be equal to 1 for any IO arc and interconnection arc of the net list, as given in block 22.

2.2. For each constant net we assign the Boolean condition 0 to each arc that has a beginning or an end at some pin connected to the net NET, as given in block 24. Denote FUNC(NET) to be a Boolean function assigned to the constant net NET.

Figure 3:
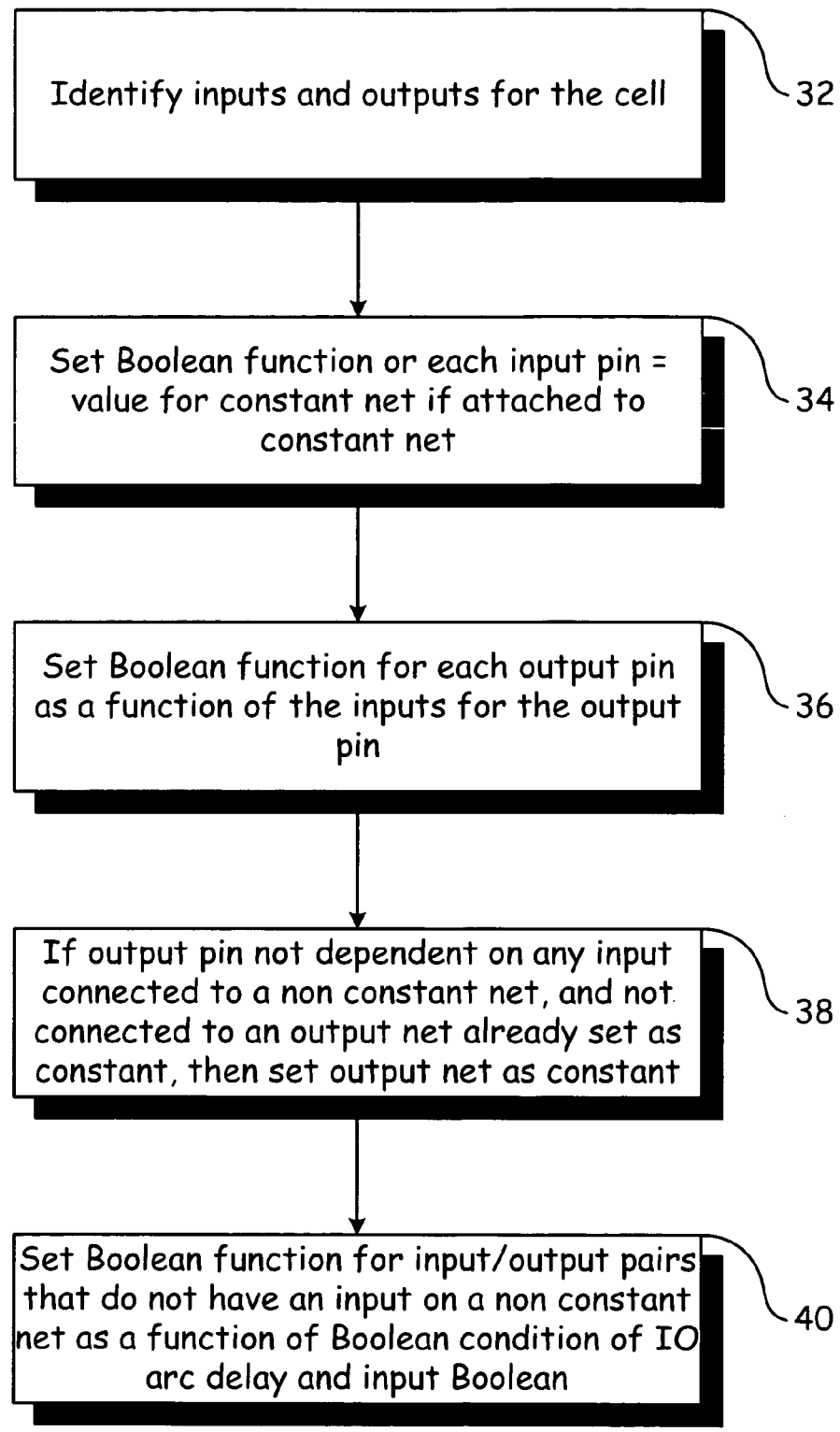
FIG. 3 is a flow chart of a subroutine for the method depicted in FIG. 2 according to a preferred embodiment of the present invention.

2.3. Examine all the logical cells of the RRAM net list, as given in block 26, and for each logical cell CELL perform the following steps 2.3.1-2.3.5, as labeled routine 100 and depicted in FIG. 3.

2.3.1. Let K be a number of inputs of the cell CELL, let Q be a number of outputs of the cell CELL. Let IN_1, IN_2, ..., IN_K be input pins of the cell CELL. Let OUT_1, OUT_2, ... OUT_Q be the output pins of the cell CELL, as given in block 32.

2.3.2. For each input pin IN_i (i=1, 2, .... K) define Boolean function FUNC(IN_i) as follows. If the pin IN_i is connected to a constant net, then the FUNC(IN_i) equals the Boolean function assigned to this constant net. Otherwise FUNC(IN_i)=yi, as given in block 34.

2.3.3. For each output OUT_j (j=1, 2, ... Q), let the Boolean function LOG_F_j(IN_1, IN_2, ... IN_K) be a logical function of the output OUT_j of the logical cell CELL, as given in block 36.

2.3.4. For each output OUT_j (j=1, 2, ... Q), evaluate the Boolean function F_j=LOG_F_j(FUNC(IN_1), FUNC(IN_2), ... FUNC(IN_K)). If this function F_j does not depend on any variable yi of the set Y, and the net OUT_NET connected to the pin OUT_j is not constant, then we make net OUT_NET constant and assign the Boolean function F_j to net OUT_NET, as given in block 38. We also assign the Boolean condition 0 to each timing arc that has the beginning or ending at a pin connected to the net OUT_NET.

2.3.5. For each pair of input IN_i and output OUT_j (i=1, 2, ... K, j=1, 2, ... Q), we evaluate the Boolean function F_i, j=LOG_F_j(FUNC(IN_1), ..., FUNC(IN_(i−1)), 0, FUNC(IN_(i+1)), ... FUNC(IN_K)) ^ LOG_F_j(FUNC(IN_1), ..., FUNC(IN_(i−1)), 1, FUNC(IN_(i+1)), ... FUNC(IN_K)). If the Boolean function F_i, j does not depend on any Boolean variable yi of the set Y, and the Boolean function COND is the current Boolean condition of the IO arc CELL.IN_i->CELL.OUT_j, then we assign the new Boolean condition to this arc: (COND & F_i, j), as given in block 40.

2.4. If during the step 2.3 a new constant net was found, then return to step 2.3 (block 26 of FIG. 2), as given in block 28. If no new constant net was found, then finish the assignment of Boolean conditions (routine 14) as given in block 30, and return to block 16 of FIG. 1.

3. Evaluation of Path Delays and Conditions

Figure 4:
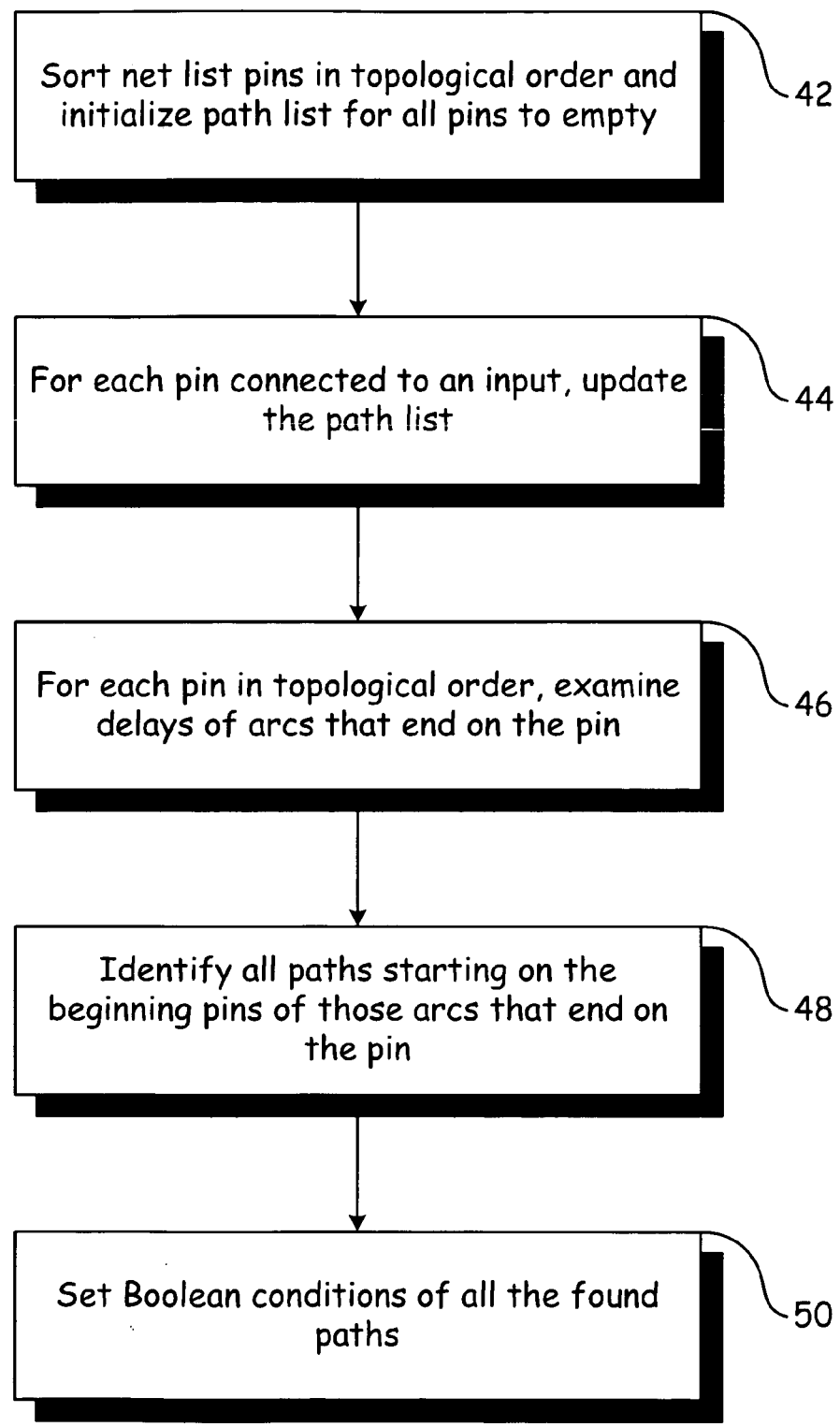
FIG. 4 is a flow chart of a method of evaluating timing path delays and conditions according to a preferred embodiment of the present invention.

The goal of the given procedure is to evaluate the maximal and minimal delays of paths that connect net list pins with net list inputs and to obtain Boolean conditions of these paths. The path delay evaluation is a well-known problem. The Boolean condition of the path is the conjunction of the Boolean conditions of the IO arcs and the interconnection arcs that are included in this path. In this part of the description we describe a way to rapidly evaluate path delays and conditions that reduces the time required for the process. The proposed procedure has an important advantage in speed when applied to an RRAM net list or any other net list with many muxing logics. This part of the method is depicted in routine 16 of FIG. 4, which is an expansion of block 16 of FIG. 1.

For each pin PIN we denote the list PATH_LIST(PIN) of paths that begin on some input of the RRAM and end on the given pin PIN. Each path PATH of the list PATH_LIST(PIN) preferably has four parameters: START(PATH) is some input of the net list that is the beginning of the delay path, COND (PATH) is a Boolean condition of the delay path, and MIN_DEL(PATH) and MAX_DEL(PATH) are minimal and maximal values of the path PATH delay, respectively.

3.1. All the pins of the net list are sorted in the topological order, as given in block 42. The topological order is such that for each IO arc or interconnection arc PIN1 to PIN2, the pin PIN1 is placed in the order earlier than the pin PIN2.

3.2. Initially, assume the set PATH_LIST(PIN) to be empty for each pin PIN of the net list.

3.3. For each pin PIN of the net list connected to some net list input INP, we add the following path PATH to the list PATH_LIST(PIN), as given in block 44:
START(PATH)=INP,
COND(PATH)=1,
MIN_DEL(PATH)=MAX_DEL(PATH)=0.

3.4. Examine all the pins of the net list in the topological order. For each examined pin PIN, take the following step 3.4.1, as given in block 46.

3.4.1. Examine all the IO arcs and interconnection arcs that are ended on the pin PIN. For each examined arc ARC, take the following step 3.4.1.1.

3.4.1.1. Let ARC_DEL be the delay of the arc ARC. Let pin BEG_PIN be the beginning of the arc ARC. Examine all the paths of the set PATH_LIST(BEG_PIN). For each examined path BEG_PATH, take the following steps 3.4.1.1.1-3.4.1.1.3, as given in block 48.

3.4.1.1.1. Assume the Boolean function TOTAL_COND=0.

3.4.1.1.2. Examine all the paths PATH of the set PATH_LIST(PIN) such that START(PATH)=START(BEG_PATH). For each examined path PATH, take the following steps 3.4.1.1.2.1-3.4.1.1.2.3.

3.4.1.1.2.1. Set Boolean function:

TOTAL_COND=TOTAL_COND|COND(PATH).

3.4.1.1.2.2. Evaluate the Boolean function:

NEW_COND=COND(PATH)&COND(BEG_PATH).

If NEW_COND!=0, then we insert a new path NEW_PATH to the set PATH_LIST(PIN) such that:
START(NEW_PATH)=START(PATH),
COND(NEW_PATH)=NEW_COND,
MIN_DEL(NEW_PATH)=min(MIN_DEL(PATH), MIN_DEL(BEG_PATH)+ARC_DEL),
MAX_DEL(NEW_PATH)=max(MAX_DEL(PATH), MAX_DEL(BEG_PATH)+ARC_DEL).

3.4.1.1.2.3. Evaluate the Boolean function:

NEW_COND=COND(PATH)&(~COND(BEG_PATH)).

If NEW_COND!=0, then we replace the Boolean condition of the path PATH with the NEW_COND, otherwise we remove the path PATH from the set PATH_LIST(PIN).

3.4.1.1.3. Evaluate the Boolean function, as given in block 50:
NEW_COND=(~TOTAL_COND)&COND(BEG_PATH).

If NEW_COND!=0, then we insert a new path NEW_PATH to the set PATH_LIST(PIN) such that:
START(NEW_PATH)=START(BEG_PATH),
COND(NEW_PATH)=NEW_COND,
MIN_DEL(NEW_PATH)=MIN_DEL(BEG_PATH)+ARC_DEL, and
MAX_DEL(NEW_PATH)=MAX_DEL(BEG_PATH)+ARC_DEL.

4. Creation of RRAM Timing Model Parameters

To obtain the IO arcs of the RRAM mega cell, we examine the pins PIN that are connected to some output OUT of the RRAM. Then we examine all the paths PATH of the set PATH_LIST(PIN). For each PATH we can generate the IO arc from the input START(PATH) to the output OUT with Boolean condition COND(PATH) and minimal and maximal delay values MIN_DEL(PATH) and MAX_DEL(PATH).

To obtain all timing restrictions, we examine all the timing restrictions of the cells of the RRAM net list. Timing restrictions such as SETUP, HOLD, RECOVERY, or SKEW are defined by a pair of cell input pins PIN1 and PIN2 (one of these pins is usually—but not always—a clock pin). Then we preferably examine all the pairs PATH1 and PATH2 of paths that belong to the sets PATH_LIST(PIN1) and PATH_LIST(PIN2) correspondingly. If COND(PATH1)&COND(PATH2)!=0, then we generate the corresponding timing restriction for the pair of mega cell inputs START(PATH1) and START(PATH2), where the value of this restriction depends on the value of the considered cell timing restriction and the values MIN_DEL(PATH1), MIN_DEL(PATH2), MAX_DEL(PATH1) and MAX_DEL(PATH2).

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of analyzing multimode delay in an integrated circuit design to produce a timing model for the integrated circuit design, the method comprising the steps of:
input a net list, IO arc delays, interconnection arc delays, and constant nets with assigned Boolean functions for the integrated circuit design, propagate the constant nets and assign Boolean conditions to the IO arc delays and the interconnection arc delays by,
examine all logical cells of the net list to determine which logical cells behave as constant nets,
when a logical cell is determined to behave as a constant net, assign the logical cell a Boolean condition, and
repeat the examination of all logical cells until no new constant nets are identified,
evaluate timing path delays and conditions for the integrated circuit design,
create the integrated circuit design timing model parameters, and
output the integrated circuit design timing model.

2. A method of analyzing multimode delay in an intergrated circuit design to produce a timing model for the intergrated circuit design, the method comprising the steps of:
input a net list, IO are delays, interconnection arc delays, and constant nets with assigned Boolean functions for the intergrated circuit design,
propagate the constant nets and assign Boolean conditions to the IO arc delays and the interconnection arc delays by,
assign an initial Boolean condition of 1 for each IO arc and interconnection arc on the net list,
for each constant net, assign a Boolean condition of 0 to each IO arc and interconnection arc that has at least one of a beginning and an ending at a pin that is connected to the constant net, and denote FUNC (NET) to be a Boolean function assigned to the constant net, and
examine all logical cells of the net list, and for each logical cell,
set K as a number of inputs of the logical cell,
set Q as a number of outputs of the logical cell,
set IN_1, IN_2, ..., IN_K as input pins of the logical cell, for each of the input pins IN_i (i=1,2, ... K), if the pin IN_i is connected to a constant net, then selectively set a Boolean function FUNC(IN_i) for the input pin to the Boolean function for the constant net, otherwise selectively set the Boolean function FUNC(IN_i) to yi,
set OUT_1, OUT_2, ... OUT_Q as output pins of the logical cell, for each of the output pins OUT_j (j=1,2, ... Q), set a Boolean function LOG_F_j (IN_1, IN_2, ... IN_K) for the output pin to a logical function of the output OUT_j of the logical cell, if F_j=LOG_F_j(FUNC(IN_1), FUNC(IN_2), ..., FUNC(IN_K)) does not depend on any yi, and any output net connected to the output pin is not already designated as a constant net, then designate the output net as constant and assign the Boolean function F_j to the output net, and assign a Boolean condition of 0 to each timing arc that begins or ends at any pin of the output net,
for each arc pair of the inputs IN_i and the outputs OUT_j, evaluate Boolean function F_i,j=LOG_F_j (FUNC(IN_1), ..., FUNC(IN_(i-1)), 0, FUNC (IN_(i+1)), ..., FUNC(IN_K))^LOG_F_j(FUNC (IN_1), ..., FUNC(IN_(i-1)), 1, FUNC(IN_(i+1)), ..., FUNC(IN_K)), when the Boolean function F_i,j does not depend on any yi, assign a Boolean condition of (COND & F_i,j) for the arc pair, where COND is a current Boolean condition of an IO arc CELL.IN_i–>CELL.OUT_j, and
repeat the examination of all logical cells until no new constant nets are identified,
evaluate timing path delays and conditions for the intergrated circuit design,
create the intergrated circuit design timing model parameters, and
output the intergrated circuit design timing model.

3. A method of analyzing multimode delay in an intergrated circuit design to produce a timing model for the intergrated circuit design, the method comprising the steps of:
input a net list, IO arc delays, interconnection arc delays, and constant nets with assigned Boolean functions for the intergrated circuit design,
propagate the constant nets and assign Boolean conditions to the IO arc delays and the interconnection arc delays,
evaluate timing path delays and conditions for the intergrated circuit design by,
sort all pins of the net list in topological order,
set PATH_LIST(PIN) to be empty for each pin of the net list,
for each pin of the net list that is connected to an input, add path START(PATH)=INP, COND(PATH)=1, MIN_DEL(PATH)=0, MAX_DEL(PATH)=0 to PATH_LIST(PIN),
examine all the pins of the net list in the topological order, for each pin, examine all the IO arcs and the interconnection arcs that end on the pin, for each examined arc, set ARC_DEL as the delay of the arc, set BEG_PIN as the beginning of the arc, examine all paths of PATH_LIST(BEG_PIN), and for each path BEG_PATH,
set Boolean function TOTAL_COND=0,
examine all paths of PATH_LIST(PIN) such that START(PATH) =START(BEG_PATH), and for each examined path,
set Boolean function TOTAL_COND=TOTAL_COND COND (PATH),
evaluate Boolean function NEW_COND =COND (PATH)&COND(BEG_PATH), if NEW_COND!=0, then insert a new path to the set PATH_LIST(PIN) such that START(NEW_PATH) =START(PATH), COND(NEW_PATH)= NEW_COND, MIN_DEL(NEW_PATH)=min(MIN_DEL(PATH), MIN_DEL(BEG_PATH)+ARC_DEL), MAX_DEL (NEW_PATH)=max(MAX_DEL(PATH), and MAX_DEL(BEG_PATH)+ARC_DEL), and
evaluate Boolean function NEW_COND=COND (PATH)&(~COND(BEG_PATH)), if NEW_COND!=0, then replace the Boolean condition of the path with NEW_COND, otherwise remove the path from the set PATH_LIST(PIN), and
evaluate Boolean function NEW_COND=(~TOTAL_ COND)&COND(BEG_PATH), if NEW_COND!=0, then insert a new path NEW_PATH to the set PATH_LIST(PIN) such that START(NEW_PATH) =START(BEG_PATH), COND(NEW_PATH)=NEW_COND, MIN_DEL(NEW_PATH)= MIN_DEL(BEG_PATH)+ARC_DEL, and MAX_DEL(NEW_PATH)=MAX_DEL(BEG_PATH)+ARC_DEL,
create the intergrated circuit design timing model parameters, and
output the intergrated circuit design timing model.

* * * * *